US009426892B2

(12) United States Patent
Kobayashi

(10) Patent No.: US 9,426,892 B2
(45) Date of Patent: Aug. 23, 2016

(54) MODULE, ELECTRONIC APPARATUS AND MOVING OBJECT

(71) Applicant: Seiko Epson Corporation, Tokyo (JP)

(72) Inventor: Tomonaga Kobayashi, Chino (JP)

(73) Assignee: Seiko Epson Corporation (JP)

( * ) Notice: Subject to any disclaimer, the term of this patent is extended or adjusted under 35 U.S.C. 154(b) by 172 days.

(21) Appl. No.: 14/183,970

(22) Filed: Feb. 19, 2014

(65) Prior Publication Data

US 2014/0247565 A1     Sep. 4, 2014

(30) Foreign Application Priority Data

Mar. 1, 2013    (JP) ................................ 2013-040401

(51) Int. Cl.
| | |
|---|---|
| H05K 1/00 | (2006.01) |
| H05K 1/02 | (2006.01) |
| H05K 3/00 | (2006.01) |
| G01P 15/125 | (2006.01) |
| B81C 1/00 | (2006.01) |
| G01P 1/02 | (2006.01) |
| G01C 19/5733 | (2012.01) |

(52) U.S. Cl.
CPC ............... *H05K 3/00* (2013.01); *B81C 1/0023* (2013.01); *G01C 19/5733* (2013.01); *G01P 1/023* (2013.01); *G01P 15/125* (2013.01); *H05K 1/00* (2013.01); *B81B 2201/025* (2013.01); *H01L 2224/48091* (2013.01); *H01L 2224/48227* (2013.01); *H01L 2224/49171* (2013.01); *H01L 2224/73265* (2013.01)

(58) Field of Classification Search
None
See application file for complete search history.

(56) References Cited

U.S. PATENT DOCUMENTS

| | | | | | |
|---|---|---|---|---|---|
| 4,658,334 | A | * | 4/1987 | McSparran | H05K 1/0218 174/262 |
| 5,250,342 | A | * | 10/1993 | Lang | H05K 9/009 174/357 |
| 5,318,855 | A | * | 6/1994 | Glovatsky | B32B 15/08 257/E23.181 |
| 5,656,864 | A | * | 8/1997 | Mitsue | H01L 21/565 257/704 |
| 5,698,316 | A | * | 12/1997 | Kuras | B32B 3/266 244/1 A |
| 5,784,259 | A | * | 7/1998 | Asakura | G06K 13/077 361/736 |
| 5,880,938 | A | * | 3/1999 | Johnsen | H05K 9/0039 174/391 |

(Continued)

FOREIGN PATENT DOCUMENTS

| | | | |
|---|---|---|---|
| JP | 2007-214441 A | 8/2007 | |
| JP | 2010-283421 A | 12/2010 | |

*Primary Examiner* — Courtney Smith
*Assistant Examiner* — Rashen E Morrison
(74) *Attorney, Agent, or Firm* — Harness, Dickey & Pierce, P.L.C.

(57) ABSTRACT

A module includes an insulating substrate that is a first base material; a cover member having a cavity section and a second recess section that form an internal space between the cover member and the insulating substrate, which is a second base material bonded to the insulating substrate on a first surface thereof; an element piece that is a first functional element, accommodated in the internal space; a recess section formed on a second surface that is a rear surface of the first surface of the cover member; and a semiconductor device that is a second functional element, connected in the recess section.

9 Claims, 9 Drawing Sheets

(56) References Cited

U.S. PATENT DOCUMENTS

| | | | | |
|---|---|---|---|---|
| 5,912,806 A * | 6/1999 | Onoda | G06K 19/077 | 361/737 |
| 6,140,575 A * | 10/2000 | Gunten | H05K 9/0045 | 174/363 |
| 6,239,486 B1 * | 5/2001 | Shimizu | H01L 23/055 | 257/676 |
| 6,420,009 B1 * | 7/2002 | Cheng | H05K 9/0016 | 361/818 |
| 6,441,481 B1 | 8/2002 | Karpman | | |
| 6,614,102 B1 * | 9/2003 | Hoffman | H01L 23/552 | 257/659 |
| 6,674,652 B2 * | 1/2004 | Forte | H05K 5/0269 | 174/363 |
| 6,717,485 B2 * | 4/2004 | Kolb | H04B 15/02 | 174/250 |
| 6,838,748 B2 * | 1/2005 | Ishio | H01L 23/3114 | 257/659 |
| 6,930,377 B1 * | 8/2005 | Bayan | H01L 23/3107 | 257/675 |
| 6,958,445 B1 * | 10/2005 | Boudreaux | H05K 1/0218 | 174/359 |
| 7,129,422 B2 * | 10/2006 | Arnold | H05K 9/0024 | 174/377 |
| 7,129,571 B2 * | 10/2006 | Kang | H01L 23/13 | 257/678 |
| 7,187,060 B2 * | 3/2007 | Usui | H01L 23/49822 | 257/659 |
| 7,202,422 B2 * | 4/2007 | Ogatsu | H05K 3/284 | 174/373 |
| 7,400,035 B2 * | 7/2008 | Abe | H01L 21/4857 | 257/528 |
| 7,623,360 B2 * | 11/2009 | English | H05K 9/0032 | 361/800 |
| 7,745,911 B2 * | 6/2010 | Lee | H01L 23/552 | 257/660 |
| 8,004,860 B2 * | 8/2011 | Salzman | H05K 3/284 | 174/350 |
| 8,031,485 B2 * | 10/2011 | Bogursky | H01L 23/552 | 361/800 |
| 8,039,931 B2 * | 10/2011 | Maynollo | H01L 23/485 | 257/341 |
| 8,102,032 B1 * | 1/2012 | Bologna | H01L 23/3128 | 257/659 |
| 8,207,618 B2 * | 6/2012 | Shimizu | H01L 21/561 | 257/787 |
| 8,237,063 B2 * | 8/2012 | Chang | H05K 9/00 | 174/382 |
| 8,258,411 B2 * | 9/2012 | Wang | H05K 3/0052 | 174/255 |
| 8,276,268 B2 * | 10/2012 | Kapusta | H05K 1/0218 | 29/832 |
| 8,330,278 B2 * | 12/2012 | Lee | H01L 23/481 | 257/622 |
| 8,350,368 B2 * | 1/2013 | Chi | H01L 23/29 | 257/659 |
| 8,362,598 B2 * | 1/2013 | Park | H01L 23/3107 | 257/660 |
| 8,383,950 B1 * | 2/2013 | Huemoeller | H05K 3/428 | 106/1.18 |
| 8,434,220 B2 * | 5/2013 | Rao | H01L 23/552 | 29/831 |
| 8,598,690 B2 * | 12/2013 | Chandra | H01L 21/561 | 174/377 |
| 8,603,912 B2 * | 12/2013 | Maynollo | H01L 23/485 | 438/622 |
| 8,614,899 B2 * | 12/2013 | Madsen | H01L 23/552 | 257/659 |
| 8,614,900 B2 * | 12/2013 | Beaumier | H01L 23/055 | 361/748 |
| 8,724,334 B2 * | 5/2014 | Nishikawa | H01L 21/561 | 29/412 |
| 8,748,228 B2 * | 6/2014 | Kim | H01L 23/552 | 438/107 |
| 2002/0126461 A1 * | 9/2002 | Yazaki | H05K 7/142 | 361/752 |
| 2002/0129951 A1 * | 9/2002 | Babb | H01L 23/552 | 174/358 |
| 2004/0136123 A1 * | 7/2004 | Nakamura | H01L 21/4832 | 361/35 |
| 2005/0006745 A1 * | 1/2005 | Nishimura | H01L 25/105 | 257/686 |
| 2005/0056916 A1 * | 3/2005 | Sakamoto | H01L 21/4821 | 257/672 |
| 2005/0206014 A1 * | 9/2005 | Sakamoto | H01L 21/4828 | 257/782 |
| 2007/0138614 A1 * | 6/2007 | Harrison | H01L 23/3677 | 257/686 |
| 2007/0141751 A1 * | 6/2007 | Mistry | H01L 21/561 | 438/109 |
| 2007/0197092 A1 * | 8/2007 | Tanaka | H01R 23/6873 | 439/607.01 |
| 2007/0273014 A1 * | 11/2007 | Lee | H01L 23/13 | 257/686 |
| 2010/0001390 A1 * | 1/2010 | Lee | H01L 23/13 | 257/686 |
| 2010/0102428 A1 * | 4/2010 | Lee et al. | | 257/686 |
| 2010/0171200 A1 * | 7/2010 | Lee | H01L 23/552 | 257/659 |
| 2010/0199492 A1 * | 8/2010 | Hiner | H01L 23/552 | 29/846 |
| 2011/0013368 A1 * | 1/2011 | Nagaike | H05K 3/284 | 361/728 |
| 2011/0108933 A1 | 5/2011 | Nakatani | | |
| 2011/0127670 A1 | 6/2011 | Perng et al. | | |
| 2011/0180933 A1 * | 7/2011 | Inoue | H01L 21/561 | 257/774 |
| 2012/0069534 A1 * | 3/2012 | Nagamura | G06F 1/1658 | 361/752 |
| 2012/0119348 A1 * | 5/2012 | Chandra | H01L 21/561 | 257/698 |
| 2012/0270371 A1 * | 10/2012 | DeBar et al. | H01L 23/3135 | 438/127 |
| 2012/0281386 A1 * | 11/2012 | Kim | H05K 9/0032 | 361/818 |
| 2013/0107490 A1 * | 5/2013 | Cheng | G06F 1/1616 | 361/807 |
| 2013/0114228 A1 * | 5/2013 | Merz | H05K 1/0218 | 361/783 |
| 2013/0161806 A1 * | 6/2013 | Zhang | H01L 24/78 | 257/676 |

\* cited by examiner

MODULE, ELECTRONIC APPARATUS AND MOVING OBJECT

BACKGROUND

1. Technical Field

The present invention relates to a module in which a functional element is accommodated, and an electronic apparatus and a moving object that include the module.

2. Related Art

In the related art, an electronic device including a module in which a functional element is accommodated has been proposed. In recent years, according to miniaturization of an electronic apparatus, miniaturization and height reduction of an electronic device used therefor have been demanded. As such an electronic device, for example, there is a sensor disclosed in JP-A-2007-214441 and an electronic device disclosed in JP-A-2010-283421. In the sensor device disclosed in JP-A-2007-214441, a sensor element that is a functional element is accommodated in an accommodating space provided between a main body (substrate) and a protection material, and at least an electronic part that drives the sensor element is provided on a surface of the main body on a side opposite to the side where the accommodating space is provided. With such a sensor, it is possible to reduce a planar area. Further, in the electronic device disclosed in JP-A-2010-283421, a quartz crystal vibrator element that is a functional element and at least an electronic part (IC chip) that drives the quartz crystal vibrator element are horizontally arranged in parallel on a substrate. In such an electronic device, although the planar area of the electronic device is large, it is possible to reduce the thickness (height), and thus, to realize so-called height reduction.

However, in the sensor device disclosed in JP-A-2007-214441 and the electronic device disclosed in JP-A-2010-283421, although it is possible to reduce the planar area and to realize the reduction in thickness, respectively, it is difficult to provide a device (module) that realizes both of the reduction of the planar area and the reduction in thickness.

SUMMARY

An advantage of some aspects of the invention is to provide a device (module) capable of realizing both of reduction of its planar area and height reduction to achieve further miniaturization.

The invention can be implemented as the following forms or application examples.

Application Example 1

This application example is directed to a module including: a first base material; a second base material that is provided over the first base material; a first functional element that is accommodated in an internal space at least a part of which is surrounded by the first base material and the second base material; a recess section that is provided on a surface of the second base material on a side opposite to the first base material; and a second functional element that is mounted in the recess section.

According to the application example, the first functional element is accommodated in the internal space at least a part of which is surrounded by the first base material and the second base material, the recess section is provided on the surface of the second base material on the side opposite to the first base material, and the second functional element is mounted in the recess section. Accordingly, as the first functional element and the second functional element overlap with each other in a planar view and the second functional element is connected in the recess section formed on a second surface of the second base material, it is possible to provide a module capable of reducing the height (achieving the height reduction) without increase in the planar area.

Application Example 2

This application example is directed to the module according to the application example described above, wherein the second functional element is connected to a bottom surface of the recess section by a bonding material.

According to this application example, it is possible to easily bond the second functional element to the bottom surface of the recess section using the bonding material. Further, since the bonding is performed inside the recess section, wall surfaces of the recess section function as a dam that prevents outflow of the bonding material, thereby making it possible to prevent the bonding material from flowing to the outside of the recess section.

Application Example 3

This application example is directed to the module according to the application example described above, wherein the recess section is formed so that a part of a side wall of the recess section is opened.

According to this application example, as the electrical connection of the second functional element is performed on the side of the opened side wall, it is possible to reduce the height of the electrical connection, to thereby further realize the height reduction.

Application Example 4

This application example is directed to the module according to the application example described above, wherein the module further includes a base substrate, and the first base material is mounted over the base substrate.

According to this application example, due to the base substrate, it is possible to provide a firmer module.

Application Example 5

This application example is directed to the module according to the application example described above, wherein the second functional element is electrically connected to at least one of the base substrate and the first base material by a connection member.

According to this application example, since the second functional element is electrically connected to at least one of the base substrate and the first base material by the connection member, it is possible to provide a module in which the second functional element and the accommodated first functional element are operable together in a single package.

Application Example 6

This application example is directed to the module according to the application example described above, wherein the first base material, the second base material and the connection member are coated with a coating member.

According to this application example, since the first base material, the second base material and the connection member are coated with the coating member, it is possible to maintain more stable characteristics with less influence from the outside.

Application Example 7

This application example is directed to an electronic apparatus including the module according to any one of Application Examples 1 to 6.

According to this application example, since the module capable of realizing the size reduction and height reduction is used, it is possible to provide a small electronic apparatus.

Application Example 8

This application example is directed to a moving object including the module according to any one of Application Examples 1 to 6.

According to this application example, since the module capable of realizing the size reduction and height reduction is used, it is possible to provide a small moving object.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of a module, an electronic apparatus and a moving object according to the invention will be described with reference to the accompanying drawings.

First Embodiment

Figure 1:
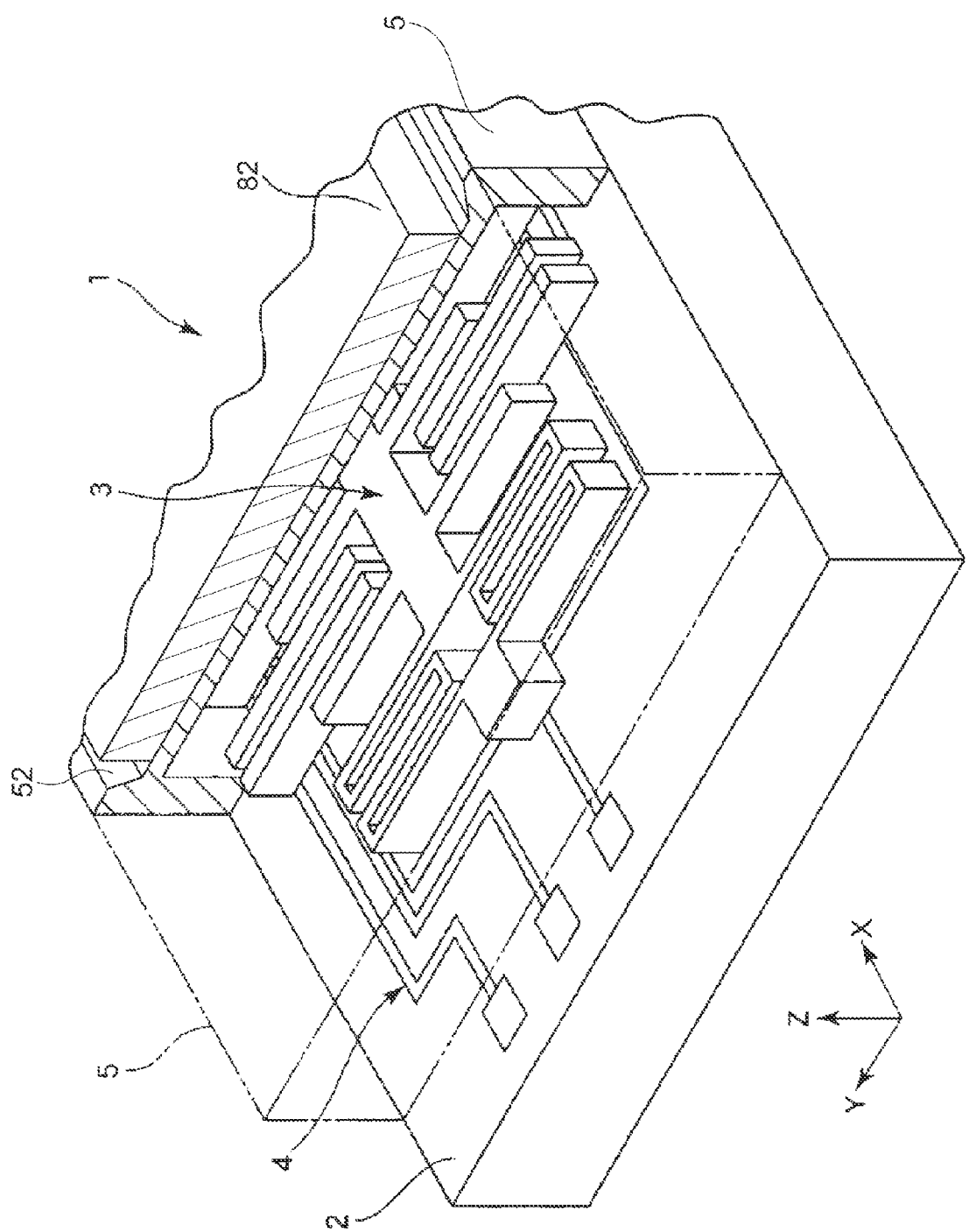
FIG. 1 is a perspective view schematically illustrating a module according to a first embodiment of the invention.
Figure 2:
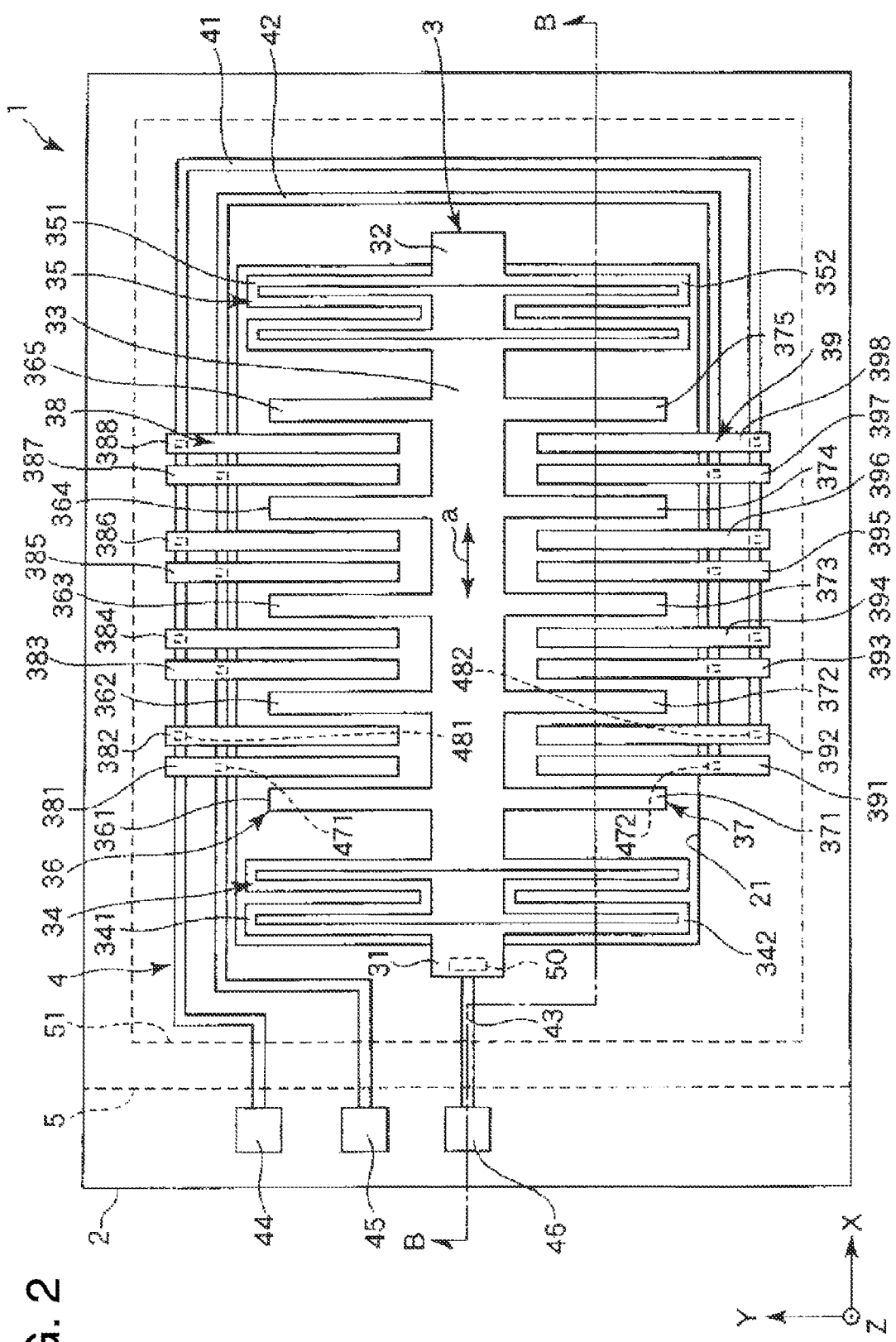
FIG. 2 is a plan view schematically illustrating the module shown in FIG. 1.
Figure 3:
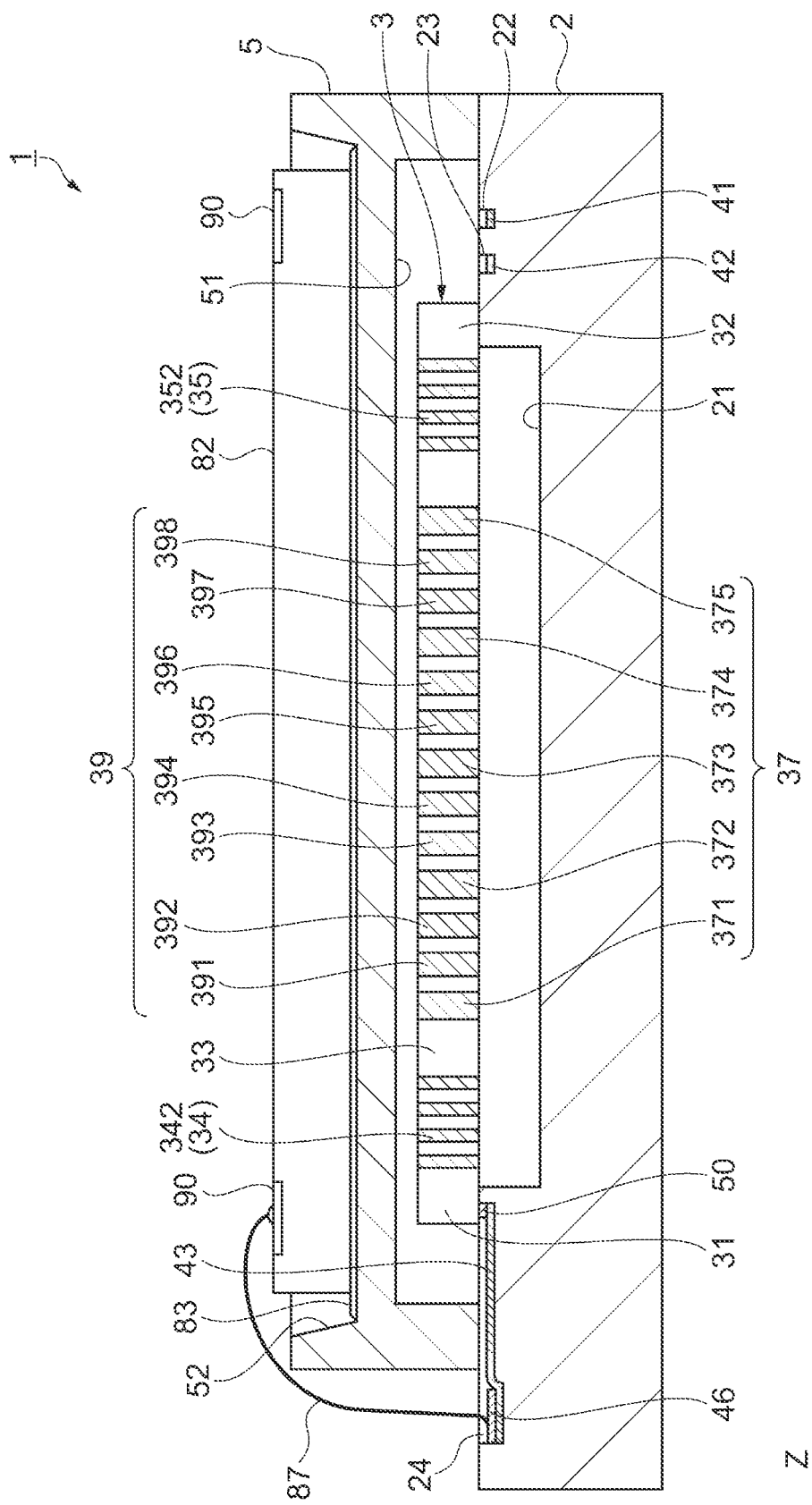
FIG. 3 is a sectional view taken along line B-B in the module shown in FIG. 2.

A first embodiment of a module according to the invention will be described with reference to FIGS. 1 to 3. FIG. 1 is a perspective view schematically illustrating the module according to the first embodiment of the invention. FIG. 2 is a plan view schematically illustrating the module shown in FIG. 1, in which a cover member is not shown. FIG. 3 is a sectional view taken along line B-B in the module shown in FIG. 2. In FIGS. 1 to 3, an X axis, a Y axis and a Z axis are shown as three axes that are orthogonal to each other. Hereinafter, a direction (right-left direction) parallel to the X axis is referred to as an "X-axis direction", a direction parallel to the Y axis is referred to as a "Y-axis direction", and a direction (up-down direction) parallel to the Z axis is referred to as a "Z-axis direction". Further, hereinafter, for ease of description, the front side (in the Z-axis direction) of a paper surface in FIG. 2 is referred to as "up", the rear side (in the Z-axis direction) of the paper surface is referred to as "down", the right side (in the X-axis direction) is referred to as "right", and the left side (in the X-axis direction) is referred to as "left". In the present embodiment, an element piece that is a first functional element will be described as a physical quantity sensor for measuring a physical quantity of acceleration, angular velocity or the like.

Module

A module 1 shown in FIG. 1 includes an insulating substrate 2 that is a first base material, an element piece 3 that is a first functional element that is bonded and supported to the insulating substrate 2, a conductive pattern 4 that is electrically connected to the element piece 3, and a cover member 5 that is a second base material provided to cover the element piece 3. Further, the module 1 includes a semiconductor device 82 that is a second functional element connected in a recess section 52 provided on an upper surface of the cover member 5. Hereinafter, the respective components that form the module 1 will be sequentially described in detail.

Insulating Substrate that is the First Base Material

First, the insulating substrate 2 that is the first base material will be described with reference to FIGS. 2 and 3. The insulating substrate 2 that is the first base material includes a function of supporting the element piece 3 that is the first functional element. The insulating substrate 2 is formed in a plate shape, and a cavity section 21 that is a part of an internal space is provided on the upper surface (one surface) thereof. The cavity section 21 is formed to contain a movable portion 33, movable electrode portions 36 and 37 and connecting portions 34 and 35 of the element piece 3, to be described later, from a planar view of the substrate 2, to thereby form an inner bottom. Such a cavity section 21 includes a clearance portion that prevents the movable portion 33, the movable electrode portions 36 and 37 and the connecting portions 34 and 35 of the element piece 3 from being in contact with the insulating substrate 2. Thus, it is possible to allow displacement of the movable portion 33 of the element piece 3.

The clearance portion may be an opening that is formed through the insulating substrate 2 in the thickness direction, instead of the cavity section 21 (of the recess shape having the inner bottom). Further, in the first embodiment, the planar shape of the cavity section 21 is quadrilateral (specifically, rectangular), but the shape is not limited thereto.

Further, on the upper surface of the insulting substrate 2, hollow portions 22, 23 and 24 recessed from the upper surface are provided on the outside of the above-mentioned cavity section 21 along its outer periphery. The hollow portions 22, 23 and 24 have shapes corresponding to the conductive pattern 4 in a planar view. Specifically, the hollow portion 22 has a shape corresponding to an interconnection 41 and an electrode 44 of the conductive pattern 4, to be described later; the hollow portion 23 has a shape corresponding to an interconnection 42 and an electrode 45 of the conductive pattern 4, to be described later; and the hollow portion 24 has a shape corresponding to an interconnection 43 and an electrode 46 of the conductive pattern 4, to be described later.

Further, the depth of a part of the hollow portion 22 where the electrode 44 is provided is larger than the depth of a part of the hollow portion 22 where the interconnection 41 is provided. Similarly, the depth of a part of the hollow portion 23 where the electrode 45 is provided is larger than the depth of a part of the hollow portion 23 where the interconnection 42 is provided. Further, the depth of a part of the hollow portion 24 where the electrode 46 is provided is larger than the depth of a part of the hollow portion 24 where the interconnection 43 is provided.

By forming the depths of some parts of the hollow portions 22, 23 and 24 to be large as described above, it is possible to prevent the substrate before the element piece 3 is formed from being bonded to the electrodes 44, 45 and 46 in the manufacturing of the module 1.

As a component material of the insulating substrate 2, specifically, it is preferable to use a silicon material or a glass material with high resistance. In particular, when the element piece 3 is formed using a silicon material as a main material, it is preferable to use a glass material that contains alkaline metal ions (movable ions) (for example, borosilicate glass such as Pyrex (registered trademark) glass). Thus, when the element piece 3 is formed using silicon as the main material, it is possible to achieve anodic bonding of the insulating substrate 2 and the element piece 3.

Further, it is preferable that the difference between thermal expansion coefficients of the component material of the insulating substrate 2 and the component material of the element piece 3 be small as much as possible. Specifically, it is preferable that the difference between thermal expansion coefficients of the component material of the insulating substrate 2 and the component material of the element piece 3 be 3 ppm/° C. or smaller. Thus, although the insulating substrate 2 and the element piece 3 are exposed to high temperature in bonding, for example, it is possible to reduce residual stress between the insulating substrate 2 and the element piece 3.

Element Piece

Next, the element piece 3 will be described with reference to FIGS. 2 and 3. The element piece 3 includes fixed portions 31 and 32, the movable portion 33, the connecting portions 34 and 35, the movable electrode portions 36 and 37, and fixed electrode portions 38 and 39. The fixed portions 31 and 32, the movable portion 33, the connecting portions 34 and 35, and the movable electrode portions 36 and 37 are integrally formed.

The element piece 3 is displaced in the X-axis direction (+X direction or −X direction) as the movable portion 33 and the movable electrode portions 36 and 37 elastically displace the connecting portions 34 and 35 according to change in a physical quantity of acceleration, angular velocity or the like, for example. According to the displacement, the size of a gap between the movable electrode portion 36 and the fixed electrode portion 38 and the size of a gap between the movable electrode portion 37 and the fixed electrode portion 39 are respectively changed. That is, according to the displacement, the size of an electrostatic capacitance between the movable electrode portion 36 and the fixed electrode portion 38 and the size of an electrostatic capacitance between the movable electrode portion 37 and the fixed electrode portion 39 are respectively changed. Accordingly, it is possible to detect the physical quantity of the acceleration, the angular velocity or the like, on the basis of these electrostatic capacitances.

The fixed portions 31 and 32 are respectively bonded onto the upper surface of the insulating substrate 2. Specifically, the fixed portion 31 is bonded to a part, on the −X direction side (left side in the figure) with respect to the cavity section 21, of the upper surface of the insulating substrate 2, and the fixed portion 32 is bonded to a part, on the +X direction side (right side in the figure) with respect to the cavity section 21, of the upper surface of the insulating substrate 2. Further, the fixed portions 31 and 32 are provided to straddle the outer periphery of the cavity section 21, respectively, in a planar view.

The positions, shapes and the like of the fixed portions 31 and 32 are determined according to the positions, shapes and the like of the connecting portions 34 and 35, the conductive pattern 4 and the like, which are not limited to the above description.

The movable portion 33 is provided between two fixed portions 31 and 32. In the present embodiment, the movable portion 33 is formed in a rectangular shape that extends in the X-axis direction. The shape of the movable portion 33 is determined according to the shape, size and the like of each section that forms the element piece 3, which is not limited to the above description.

The movable portion 33 is connected to the fixed portion 31 through the connecting portion 34, and is connected to the fixed portion 32 through the connecting portion 35. More specifically, a left end part of the movable portion 33 is connected to the fixed portion 31 through the connecting portion 34, and a right end part of the movable portion 33 is connected to the fixed portion 32 through the connecting portion 35. The connecting portions 34 and 35 connect the movable portion 33 to the fixed portions 31 and 32 so that the movable portion 33 can be displaced with respect to the fixed portions 31 and 32. In the present embodiment, the connecting portions 34 and 35 are formed so that the movable portion 33 can be displaced in the X-axis direction (+X direction or −X direction), as indicated by arrow "a" in FIG. 2.

Specifically, the connecting portion 34 includes two beams 341 and 342. Further, the beams 341 and 342 are respectively formed in shapes that extend in the X-axis direction while meandering in the Y-axis direction. In other words, the beams 341 and 342 are respectively formed in shapes folded back plural times (three times in the present embodiment) in the Y-axis direction. The number of folding times of each of the beams 341 and 342 may be 1, 2 or 4 or more.

Similarly, the connecting portion 35 includes two beams 351 and 352 formed in shapes that extend in the X-axis direction while meandering in the Y-axis direction. As long as the connecting portions 34 and 35 can support the movable portion 33 to be displaced with respect to the insulating substrate 2, the connecting portions 34 and 35 are not limited to the above description, and for example, may be formed by a pair of beams that respectively extend in the +Y direction and the −Y direction from the both end parts of the movable portion 33.

On one side (+Y direction side) in the width direction of the movable portion 33 that is supported to be displaced with respect to the insulating substrate 2 in the X-axis direction as described above, the movable electrode portion 36 is provided, and on the other side (−Y direction side) thereof, the movable electrode portion 37 is provided. The movable electrode portion 36 faces the fixed electrode portion 38 at an interval. Further, the movable electrode portion 37 faces the fixed electrode portion 39 at an interval.

The movable electrode portion 36 is provided with plural movable electrode fingers 361 to 365 that protrude from the movable portion 33 in the +Y direction, and are arranged to form a comb tooth shape. The movable electrode fingers 361, 362, 363, 364 and 365 are sequentially arranged from the −X direction to the +X direction. Similarly, the movable electrode portion 37 is provided with plural movable electrode fingers 371 to 375 that protrude from the movable portion 33 in the −Y direction, and are arranged to form a comb tooth shape. The movable electrode fingers 371, 372, 373, 374 and 375 are sequentially arranged from the −X direction to the +X direction.

As described above, the plural movable electrode fingers 361 to 365 and the plural movable electrode fingers 371 to 375 are respectively arranged in a direction where the movable portion 33 is displaced (that is, in the Y-axis direction). Thus, it is possible to efficiently change electrostatic capacitances between fixed electrode fingers 382, 384, 386 and 388, to be described later, and the movable electrode portion 36 and electrostatic capacitances between fixed electrode fingers 381, 383, 385 and 387 and the movable electrode portion 36, according to the displacement of the movable portion 33. Similarly, it is possible to efficiently change electrostatic capacitances between fixed electrode fingers 392, 394, 396 and 398, to be described later, and the movable electrode portion 37 and electrostatic capacitances between fixed electrode fingers 391, 393, 395 and 397 and the movable electrode portion 37, according to the displacement of the movable portion 33. Thus, it is possible to achieve an excellent detection accuracy when the module 1 is used as a physical quantity sensor device.

The fixed electrode portion 38 includes the plural fixed electrode fingers 381 to 388 arranged to form a comb tooth shape engaged with the plural movable electrode fingers 361 to 365 of the above-described movable electrode portion 36 at intervals. End parts, opposite to the movable portion 33, of the plural fixed electrode fingers 381 to 388 are respectively bonded to a part, in the +Y direction with respect to the cavity section 21, of the upper surface of the insulating substrate 2. Thus, each of the fixed electrode fingers 381 to 388 includes a fixed end that is an end on the fixed side, and a free end that extends in the −Y direction.

The fixed electrode fingers 381 to 388 are sequentially arranged from the −X direction to the +X direction. Further, the fixed electrode fingers 381 and 382 are provided in pair to face the movable electrode fingers 361 and 362, the fixed electrode fingers 383 and 384 are provided in pair to face the movable electrode fingers 362 and 363, the fixed electrode fingers 385 and 386 are provided in pair to face the movable electrode fingers 363 and 364, and the fixed electrode fingers 387 and 388 are provided in pair to face the movable electrode fingers 364 and 365.

Here, the fixed electrode fingers 382, 384, 386 and 388 respectively correspond to first fixed electrode fingers, and the fixed electrode fingers 381, 383, 385 and 387 respectively correspond to second fixed electrode fingers that are spaced apart from the first fixed electrode fingers on the insulating substrate 2 through a gap. As described above, the plural fixed electrode fingers 381 to 388 include the plural first fixed electrode fingers and the plural second fixed electrode fingers that are alternately arranged. In other words, the first fixed electrode finger is arranged on one side of the movable electrode finger, and the second fixed electrode finger is arranged on the other side thereof.

The first fixed electrode fingers 382, 384, 386 and 388 and the second fixed electrode fingers 381, 383, 385 and 387 are separated from each other on the insulating substrate 2. In other words, the first fixed electrode fingers 382, 384, 386 and 388 and the second fixed electrode fingers 381, 383, 385 and 387 are not connected to each other on the insulating substrate 2, and are independently provided like islands. Thus, it is possible to electrically insulate the first fixed electrode fingers 382, 384, 386 and 388 and the second fixed electrode fingers 381, 383, 385 and 387. Thus, it is possible to individually measure the electrostatic capacitances between the first fixed electrode fingers 382, 384, 386 and 388 and the movable electrode portion 36 and the electrostatic capacitances between the second fixed electrode fingers 381, 383, 385 and 387 and the movable electrode portion 36, and to detect the physical quantity with high accuracy on the basis of the measurement result.

In the present embodiment, the fixed electrode fingers 381 to 388 are separated from each other on the insulating substrate 2. In other words, the fixed electrode fingers 381 to 388 are not connected to each other on the insulating substrate 2, and are independently provided like islands. Thus, it is possible to align the lengths of the fixed electrode fingers 381 to 388 in the Y-axis direction. Thus, it is possible to achieve miniaturization of the fixed electrode fingers 381 to 388 while securing an area necessary for obtaining a sufficient bonding strength of each bonding section of each of the fixed electrode fingers 381 to 388 and the insulating substrate 2. Thus, it is possible to achieve miniaturization of the module 1 while achieving excellent impact resistance of the module 1.

Similarly, the fixed electrode portion 39 includes the plural fixed electrode fingers 391 to 398 arranged to form a comb tooth shape engaged with the plural movable electrode fingers 371 to 375 of the above-described movable electrode portion 37 at intervals. End parts, opposite to the movable portion 33, of the plural fixed electrode fingers 391 to 398 are respectively bonded to a part, in the −Y direction with respect to the cavity section 21, of the upper surface of the insulting substrate 2. Further, each of the fixed electrode fingers 391 to 398 includes a fixed end that is an end on the fixed side, and a free end that extends in the +Y direction.

The fixed electrode fingers 391 to 398 are sequentially arranged from the −X direction to the +X direction in this order. Further, the fixed electrode fingers 391 and 392 are provided in pair to face the movable electrode fingers 371 and 372, the fixed electrode fingers 393 and 394 are provided in pair to face the movable electrode fingers 372 and 373, the fixed electrode fingers 395 and 396 are provided in pair to face the movable electrode fingers 373 and 374, and the fixed electrode fingers 397 and 398 are provided in pair to face the movable electrode fingers 374 and 375.

Here, the fixed electrode fingers 392, 394, 396 and 398 respectively correspond to first fixed electrode fingers, and the fixed electrode fingers 391, 393, 395 and 397 respectively correspond to second fixed electrode fingers that are spaced apart from the first fixed electrode fingers on the insulating substrate 2 through a gap. As described above, the plural fixed electrode fingers 391 to 398 include the plural first fixed electrode fingers and the plural second fixed electrode fingers that are alternately arranged. In other words, the first fixed electrode finger is arranged on one side of the movable electrode finger, and the second fixed electrode finger is arranged on the other side thereof.

The first fixed electrode fingers 392, 394, 396 and 398 and the second fixed electrode fingers 391, 393, 395 and 397 are separated from each other on the insulating substrate 2, similarly to the above-described fixed electrode portion 38. Thus, it is possible to individually measure the electrostatic capacitances between the first fixed electrode fingers 392, 394, 396 and 398 and the movable electrode portion 37, and the electrostatic capacitances between the second fixed electrode fingers 391, 393, 395 and 397 and the movable electrode portion 37, and to detect the physical quantity with high accuracy on the basis of the measurement result.

In the present embodiment, the fixed electrode fingers 391 to 398 are separated from each other on the insulating substrate 2, similarly to the above-described fixed electrode portion 38. Thus, it is possible to achieve miniaturization of the fixed electrode fingers 391 to 398 while securing a sufficient area of each bonding section of each of the fixed electrode fingers 391 to 398 and the insulating substrate 2. Thus, it is possible to achieve miniaturization of the module 1 while achieving excellent impact resistance of the module 1.

The element piece 3 (that is, the fixed portions 31 and 32, the movable portion 33, the connecting portions 34 and 35, the plural fixed electrode fingers 381 to 388 and 391 to 398, and the plural movable electrode fingers 361 to 365 and 371 to 375) is formed by etching a single substrate, to be described later.

Thus, it is possible to increase the thickness of the fixed portions 31 and 32, the movable portion 33, the connecting portions 34 and 35, the plural fixed electrode fingers 381 to 388 and 391 to 398, and the plural movable electrode fingers 361 to 365 and 371 to 375. Further, it is possible to simply conform the thicknesses of these portions and fingers with high accuracy. Thus, it is possible to achieve high sensitivity of the module 1, and to improve impact resistance of the module 1.

Further, a component material of the element piece 3 is not particularly limited as long as it is possible to detect the physical quantity based on the change in the above-described electrostatic capacitances, but it is preferable to use a semiconductor. Specifically, for example, it is preferable to use a silicon material such as single crystal silicon or polysilicon. That is, it is preferable that the fixed portions 31 and 32, the movable portion 33, the connecting portions 34 and 35, the plural fixed electrode fingers 381 to 388 and 391 to 398, and the plural movable electrode fingers 361 to 365 and 371 to 375 be formed using silicon as a main material.

It is possible to process silicon with high accuracy by etching. Thus, by forming the element piece 3 using silicon as the main material, it is possible to achieve excellent dimensional accuracy of the element piece 3, and as a result, to achieve high sensitivity of the module 1 that is the physical quantity sensor device. Further, since silicon has small fatigue, it is possible to improve durability of the module 1. Further, it is preferable that impurities such as phosphorous or boron be doped to the silicon material that forms the element piece 3. Thus, it is possible to achieve excellent conductivity of the element piece 3.

Further, as described above, by bonding the fixed portions 31 and 32 and the fixed electrode portions 38 and 39 onto the upper surface of the insulating substrate 2, the element piece 3 is supported on the insulating substrate 2. In the present embodiment, the insulating substrate 2 and the element piece 3 are bonded to each other through an insulating film (not shown).

A method of bonding the element piece 3 (specifically, the fixed portions 31 and 32 and the respective fixed electrode fingers 381 to 388 and 391 to 398) to the insulating substrate 2 is not particularly limited, but an anodic bonding method is preferably used. Thus, it is possible to firmly bond the fixed portions 31 and 32 and the fixed electrode portions 38 and 39 (the respective fixed electrode fingers 381 to 388 and 391 to 398) to the insulating substrate 2. Thus, it is possible to improve impact resistance of the module 1. Further, it is possible to bond the fixed portions 31 and 32 and the fixed electrode portions 38 and 39 (the respective fixed electrode fingers 381 to 388 and 391 to 398) to a desired position on the insulating substrate 2 with high accuracy. Thus, it is possible to achieve high sensitivity of the module 1 that is the physical quantity sensor device. In this case, as described above, the element piece 3 is formed using silicon as the main material, and the insulating substrate 2 is formed using a glass material including alkaline metal ions.

Conductive Pattern

The conductive pattern 4 is provided on the upper surface of the insulating substrate 2 (on the surface on the side of the fixed electrode portions 38 and 39). The conductive pattern 4 is formed using the interconnections 41, 42 and 43, and the electrodes 44, 45 and 46.

The interconnection 41 is provided outside the cavity section 21 of the insulting substrate 2 and is formed along the outer periphery of the cavity section 21. Further, one end part of the interconnection 41 is connected to the electrode 44 in an outer peripheral part of the upper surface of the insulating substrate 2 (a part of the insulating substrate 2 outside the cover member 5). The interconnection 41 is electrically connected to each of the fixed electrode fingers 382, 384, 386 and 388 and each of the fixed electrode fingers 392, 394, 396 and 398 that are the first fixed electrode fingers of the element piece 3. Here, the interconnection 41 is a first interconnection electrically connected to each of the first fixed electrode fingers.

Further, the interconnection 42 is provided inside the interconnection 41, and is provided outside the cavity section 21 of the insulating substrate 2 along the outer periphery thereof. Further, one end part of the interconnection 42 is connected to the electrode 45 in the outer periphery part of the upper surface of the insulating substrate 2 (the part of the insulating substrate 2 outside the cover member 5) to be arranged to be spaced apart from the electrode 44.

The interconnection 43 is provided to extend on the outer periphery of the upper surface of the insulating substrate 2 (the part of the insulating substrate 2 outside the cover member 5) from a bonding section with respect to the fixed portion 31 on the insulating substrate 2. Further, an end part, opposite to the fixed portion 31, of the interconnection 43 is connected to the electrode 46 on the outer periphery part of the upper surface of the insulating substrate 2 (the part of the insulating substrate 2 outside the cover member 5) to be arranged to be spaced apart from the electrodes 44 and 45.

Component materials of the interconnections 41 to 43 are not particularly limited as long as they are conductive, and various electrode materials may be used. For example, oxides (transparent electrode materials) such as indium tin oxide (ITO), indium zinc oxide (IZO), $In_2O_3$, $SnO_2$, $SnO_2$ containing Sb or ZnO containing Al; Au, Pt, Ag, Cu, Al, an alloy thereof, or the like may be used, or one type of or two or more types of combinations thereof may be used.

Here, as the component materials of the interconnections 41 to 43, it is preferable to use a transparent electrode material (particularly, ITO). If the interconnections 41 and 42 are formed of the transparent electrode material, respectively, when the insulating substrate 2 is a transparent substrate, it is possible to easily view foreign substances that are present on the surface of the insulating substrate 2 on the side of the fixed electrode portions 38 and 39 from the surface of the insulating substrate 2 on the side opposite to the fixed electrode portions 38 and 39. Thus, it is possible to reliably provide the module 1 as the physical quantity sensor device with high sensitivity.

Further, component materials of the electrodes 44 to 46 are not particularly limited as long as they are conductive, and various electrode materials may be used, similar to the above-described interconnections 41 to 43. In the present embodiment, as the component materials of the electrodes 44 to 46, the same component materials as those of protrusions 471, 472, 481 and 482, to be described later, are used.

As the interconnections 41 and 42 (the first interconnection and the second interconnection) are provided on the upper surface of the insulating substrate 2 as described above, it is possible to measure the electrostatic capacitances between the first fixed electrode fingers 382, 384, 386 and 388 and the movable electrode portion 36 and the electrostatic capacitances between the first fixed electrode fingers 392, 394, 396 and 398 and the movable electrode portion 37 through the interconnection 41, and to measure the electrostatic capacitances between the second fixed electrode fingers 381, 383, 385 and 387 and the movable electrode portion 36 and the electrostatic capacitances between the second fixed electrode fingers 391, 393, 395 and 397 and the movable electrode portion 37 through the interconnection 42.

In the present embodiment, by using the electrode and the electrode 46, it is possible to measure the electrostatic capacitances between the first fixed electrode fingers 382, 384, 386 and 388 and the movable electrode portion 36 and the electrostatic capacitances between the first fixed electrode fingers 392, 394, 396 and 398 and the movable electrode portion 37. Further, by using the electrode 45 and the electrode 46, it is possible to measure the electrostatic capacitances between the second fixed electrode fingers 381, 383, 385 and 387 and the movable electrode portion 36 and the electrostatic capacitances between the second fixed electrode fingers 391, 393, 395 and 397 and the movable electrode portion 37. Further, since the interconnections 41 and 42 are provided on the upper surface of the insulating substrate 2 (that is, on the surface on the side of the fixed electrode portions 38 and 39), it is easy to perform electrical connection to the fixed electrode portions 38 and 39 and to determine the positions thereof. Thus, it is possible to improve reliability (particularly, impact resistance and detection accuracy) of the module 1.

Further, the interconnection 41 and the electrode 44 are provided in the hollow portion 22 of the insulating substrate 2, the interconnection 42 and the electrode 45 are provided in the hollow portion 23 of the insulating substrate 2, and the interconnection 43 and the electrode 46 are provided in the hollow portion 24 of the insulating substrate 2. Thus, it is possible to prevent the interconnections 41 to 43 from protruding from the planar surface of the insulating substrate 2. Thus, it is possible to perform electrical connection between the fixed electrode fingers 382, 384, 386, 388, 392, 394, 396 and 398 and the interconnection 41, and electrical connection between the fixed electrode fingers 381 383, 385, 387, 391, 393, 395 and 397 and the interconnection 42 while reliably achieving bonding (fixing) of each of the fixed electrode fingers 381 to 388 and 391 to 398 and the insulating substrate 2. Similarly, it is possible to perform electrical connection between the fixed portion 31 and the interconnection 43 while reliably achieving bonding (fixing) of the fixed portion 31 and the insulating substrate 2. Here, when the thickness of each of the interconnections 41 to 43 is t, and the depth of the part of each of the hollow portions 22 to 24 where the interconnection 41 is provided is d, the relationship of t<d is satisfied.

Thus, a gap (not shown) is formed between the fixed electrode finger 391 and the insulating film on the interconnection 41, for example. The same gap as this gap is also formed between each of the other fixed electrode fingers and the insulating film on each of the interconnections 41 and 42. Due to the gaps, in manufacturing of the module 1, it is possible to discharge gas generated when the anodic bonding between the insulating substrate 2 and the element piece 3 is performed.

Similarly, although not shown, a gap is formed between the cover member 5 and the insulting film on the interconnection 43. The gap is also formed between the cover member 5 and the insulating film on the interconnections 41 and 42. These gaps may be used for decompression of the inside of the cover member 5 or filling up with inertial gas. These gaps may be filled with an adhesive when the cover member 5 and the insulating substrate 2 are bonded to each other by the adhesive.

On the interconnection 41 that is the first interconnection, plural protrusions 481 and plural protrusions 482 that are first conductive protrusions are provided. The plural protrusions 481 are provided corresponding to the fixed electrode fingers 382, 384, 386 and 388 that are the plural first fixed electrode fingers, and the plural protrusions 482 are provided corresponding to the fixed electrode fingers 392, 394, 396 and 398 that are the plural first fixed electrode fingers.

Further, the fixed electrode fingers 382, 384, 386 and 388 and the interconnection 41 are electrically connected to each other through the plural protrusions 481, and the fixed electrode fingers 392, 394, 396 and 398 and the interconnection 41 are electrically connected to each other through the plural protrusions 482. Thus, it is possible to perform electrical connection between each of the fixed electrode fingers 382, 384, 386, 388, 392, 394, 396 and 398 and the interconnection 41 while preventing unintentional electrical connection (short circuit) between the interconnection 41 and other portions.

Similarly, on the interconnection 42 that is the second interconnection, plural protrusions 471 and plural protrusions 472 that are second conductive protrusions are provided. The plural protrusions 471 are provided corresponding to the fixed electrode fingers 381, 383, 385 and 387 that are the plural second fixed electrode fingers, and the plural protrusions 472 are provided corresponding to the fixed electrode fingers 391, 393, 395 and 397 that are the plural second fixed electrode fingers.

Further, the fixed electrode fingers 381, 383, 385 and 387 and the interconnection 42 are electrically connected to each other through the plural protrusions 471, and the fixed electrode fingers 391, 393, 395 and 397 and the interconnection 42 are electrically connected to each other through the plural protrusions 472. Thus, it is possible to perform electrical connection between each of the fixed electrode fingers 381, 383, 385, 387, 391, 393, 395 and 397 and the interconnection 42 while preventing unintentional electrical connection (short circuit) between the interconnection 42 and other portions.

Component materials of the protrusions 471, 472, 481 and 482 are not particularly limited as long as they are conductive, and various electrode materials may be used. For example, it is preferable to use metal such as a metallic single body such as Au, Pt, Ag, Cu or Al or an alloy thereof, for example. By forming the protrusions 471, 472, 481 and 482 using such metal, it is possible to reduce contact resistance between the interconnections 41 and 42 and the fixed electrode portions 38 and 39.

Further, when the thickness of each of the interconnections 41 to 43 is t, the depth of the part of each of the hollow portions 22 to 24 where the interconnection 41 is provided is d, and the height of each of the protrusions 471, 472, 481 and 482 is h, the relationship of $d \approx t+h$ is satisfied.

Further, although not shown, an insulating film is provided on the interconnections 41 to 43. Further, the insulating film is not formed on the protrusions 471, 472, 481, 482 and 50, and thus, the surfaces of the protrusions are exposed. The insulating film has a function of preventing unintentional electrical connection (short circuit) between the conductive pattern 4 and the element piece 3. Thus, it is possible to perform electrical connection between each of the first fixed electrode fingers 382, 384, 386, 388, 392, 394, 396 and 398 and the interconnection 41, and electrical connection between each of the second fixed electrode fingers 381, 383, 385, 387, 391, 393, 395 and 397 and the interconnection 42 while reliably preventing unintentional electrical connection (short circuit) between the interconnections 41 and 42 and other portions. Further, it is possible to perform electrical connection between the fixed portion 31 and the interconnection 43 while reliably preventing unintentional electrical connection (short circuit) between the interconnection 43 and other portions.

The insulating film is formed over approximately the entire area of the upper surface of the insulating substrate 2 except for areas where the protrusions 471, 472, 481, 482 and 50 and the electrodes 44 to 46 are formed. The area where the insulating film is formed is not limited to the above-described area, and for example, may have a shape in which a bonding portion of the upper surface of the insulating substrate 2 and the element piece 3 or a bonding portion of the upper surface of the insulating substrate 2 and the cover member 5 is excluded, as long as the insulating film can cover the interconnections 41 to 43.

A component material of the insulating film is not particularly limited, and various insulating materials may be used. When the insulating substrate 2 is formed of a glass material (particularly, a material including alkaline metal ions), it is preferable to use silicon dioxide ($SiO_2$). Thus, it is possible to prevent the above-mentioned unintentional electrical connection, and to achieve anodic bonding between the insulating substrate 2 and the element piece 3 even though the insulating film is present in the bonding portion of the upper surface of the insulating substrate 2 and the element piece 3.

Further, the thickness of the insulating film (average thickness) is not particularly limited, but is preferably about 10 nm to about 1000 nm, and more preferably about 10 nm to about 200 nm. If the insulating film is formed in the above-mentioned thickness range, it is possible to prevent the above-mentioned unintentional electrical connection. Further, when the insulating substrate 2 is formed of a glass material including alkaline metal ions and the element piece 3 is formed using silicon as the main material, it is possible to achieve anodic bonding between the insulating substrate 2 and the element piece 3 through the insulating film even though the insulating film is present in the bonding portion of the upper surface of the insulating substrate 2 and the element piece 3.

Cover Member that is the Second Base Material

Next, the cover member 5 that is the second base material will be described with reference to FIGS. 1 and 3. The cover member 5 has a function of protecting the element piece 3, and has a function of mounting the semiconductor device 82 that is the second functional element, to be described later. The cover member 5 of the present embodiment has a rectangular plate shape in a planar view, and has a second recess section 51 that forms an internal space on a first surface (lower surface) that is one surface thereof. The second recess section 51 is formed to allow displacement of the movable portion 33, the movable electrode portions 36 and 37 and the like of the element piece 3.

Further, an outer portion, extending from the second recess section 51, of the first surface (lower surface) of the cover member 5 is bonded to the upper surface of the insulating substrate 2 described above. In the present embodiment, the insulating substrate 2 and the cover member 5 are bonded to each other through an insulating film (not shown). A bonding method of the cover member 5 and the insulating substrate 2 is not particularly limited, but for example, a direct bonding method such as a bonding method using an adhesive or an anodic bonding method, or the like may be used. The bonding of the cover member 5 and the insulating substrate 2 may be performed by indirect bonding using a spacer or the like between the cover member 5 and the insulating substrate 2, instead of the above-mentioned direct bonding. Further, a component material of the cover member 5 is not particularly limited as long as it is possible to achieve the above-described functions. For example, a silicon material, a glass material or the like may be preferably used.

The recess section 52 for mounting the semiconductor device 82 that is the second functional element to be described later is formed on a second surface (upper surface) that is a top surface of the cover member 5 that is a rear surface of the first surface thereof. The recess section 52 has a bottomed concave shape recessed from the second surface (upper surface) of the cover member 5, and is surrounded by a wall along the periphery of the cover member 5. Further, the semiconductor device 82 is bonded to the bottom surface of the recess section 52 by an adhesive (bonding material) 83 using resin as a base material, for example.

As described above, by mounting and connecting the semiconductor device 82 in the recess section 52 recessed from the second surface (upper surface) that is the top surface of the cover member 5, it is possible to reduce the height size from the first surface of the cover member 5 to the upper surface of the semiconductor device 82. In other words, it is possible to reduce the height of the module 1.

Semiconductor Device that is the Second Functional Element

Next, the semiconductor device 82 that is the second functional element will be described. The semiconductor device 82 that is the second functional element is an integrated circuit element (IC), for example, and has a function of driving the module 1. A bonding pad 90 for electric connection is provided on the upper surface of the semiconductor device 82, and for example, is connected to the electrodes 44, 45 and 46 or the like provided on the upper surface of the insulating substrate 2 by a metallic interconnection (bonding wire) 87 that is a connection member using a wire bonding method or the like. Further, this connection leads to each portion of the element piece 3 that is the first functional element through the electrodes 44, 45 and 46 or the like. By forming an angular velocity detection circuit or an acceleration detection circuit in the semiconductor device 82, it is possible to form the module 1 as a gyro sensor or an acceleration sensor. The electric connection may be performed by direct bonding using gold bumps or the like as the connection member, instead of the metallic interconnection 87.

The module 1 according to the above-described first embodiment includes the insulating substrate 2 that is the first base material, in which the element piece 3 that is the first functional element is accommodated and bonded in an internal space formed by the second recess section 51 and the cavity section 21, and the cover member 5 that is the second base material. Further, the recess section 52 is provided on the surface (second surface), opposite to the bonding surface (first surface), of the cover member 5, and the semiconductor device 82 that is the second functional element is mounted and connected in the recess section 52. Accordingly, as the element piece 3 and the semiconductor device 82 are provided to overlap in a planar view and the semiconductor device 82 is connected in the recess section 52 recessed from the second surface of the cover member 5, it is possible to reduce the height without increase in the planar area. In other words, it is possible to achieve a module with a small size and a low height in which the height is reduced without increase in the planar area.

Second Embodiment

Figure 4A:
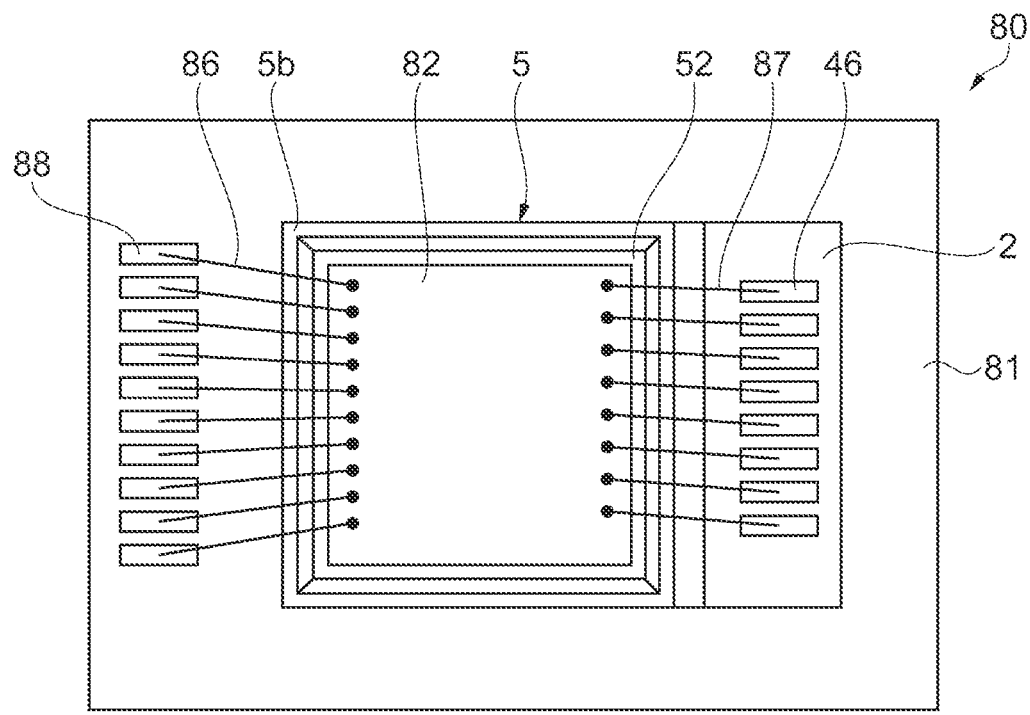
FIG. 4A is a plan view schematically illustrating a module according to a second embodiment of the invention.
Figure 4B:
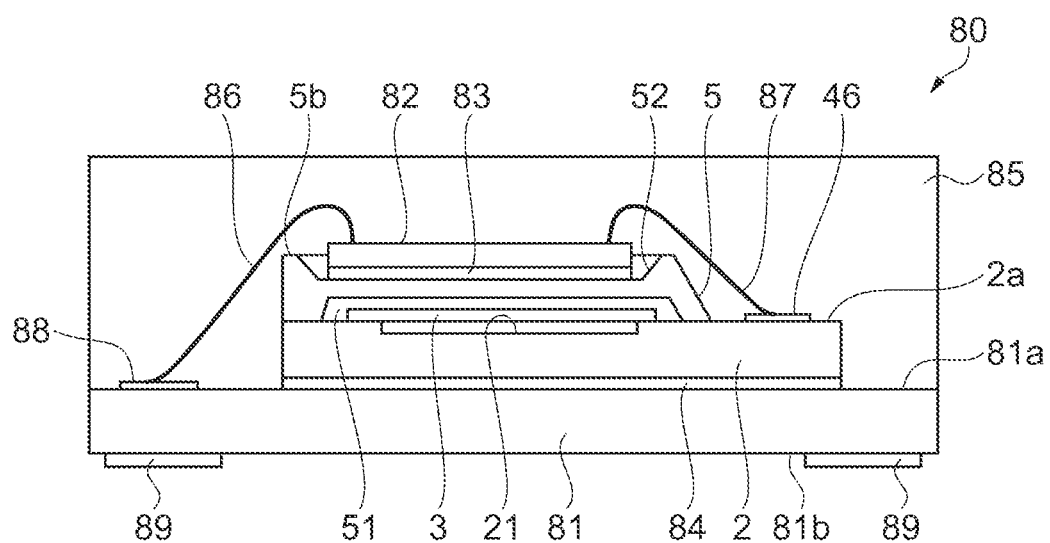
FIG. 4B is a front sectional view thereof.

A second embodiment of a module according to the invention will be described with reference to FIGS. 4A and 4B. FIG. 4A is a plan view schematically illustrating the module according to the second embodiment of the invention, and FIG. 4B is a front sectional view thereof. In description of the second embodiment, the same reference numerals are given to the same configurations as in the first embodiment, and description thereof will not be repeated. In a state shown in FIG. 4A, a molded member that forms the module is not shown.

A module 80 shown in FIGS. 4A and 4B includes a base substrate 81, an insulating substrate 2 that is a first base material connected to the base substrate 81, an element piece 3 that is a first functional element bonded and supported to the insulating substrate 2, and a cover member 5 that is a second base material provided to cover the element piece 3. Further, the module 80 includes a semiconductor device 82 that is a second functional element connected in a recess section 52 provided on an upper surface 5b of the cover member 5. Further, the module 80 includes a molded member 85 provided to cover an upper surface 81a of the base substrate 81, the insulating substrate 2 that forms the module 80, the cover member 5 and the semiconductor device 82.

Hereinafter, a configuration of the module 80 will be described, but since the insulating substrate 2, the element piece 3, the cover member 5 and the semiconductor device 82 have the same configurations as in the first embodiment, the same reference numerals are given thereto, and description thereof will be simplified or will not be repeated.

The base substrate 81 has a rectangular plate shape in a planar view, and the insulating substrate 2 is mounted and connected onto the upper surface 81a thereof. A component material of the base substrate 81 is not particularly limited as long as it has an electrically insulating property, but it is preferable to use a ceramic substrate, an epoxy resin substrate or the like. In the present embodiment, an example in which the ceramic substrate is used will be described.

The insulating substrate 2 is connected and fixed onto the upper surface 81a of the base substrate 81 using an epoxy-based resin adhesive 84 or the like, for example. Further, plural connection terminals 88, in this example, ten connection terminals 88 are provided in a portion where the insulating substrate 2 is not mounted, in the upper surface 81a of the base substrate 81, and external connection terminals 89 are provided on a lower surface 81b that is a surface opposite to the upper surface 81a. The connection terminals 88 are respectively connected to the corresponding external connection terminals 89 or the like by in-layer interconnections of such as an interconnection pattern, through holes (not shown) or the like formed on the upper surface 81a of the base substrate 81. These connection terminals 88, the external connection terminals 89 and the interconnection pattern that connects the terminals are formed by baking a metallic interconnection material such as tungsten (W) or molybdenum (Mo) on a ceramic insulating material through screen printing, and by performing plating of nickel (Ni), gold (Au) or the like thereon. In the figure, an example in which the insulating substrate 2 is directly connected to the base substrate 81 by the resin adhesive 84 has been described, but a configuration in which a connection pad (not shown) that is provided, similarly to the connection terminal 88, is provided on the upper surface 81a of the base substrate 81 that faces the insulating substrate 2 may be used.

On the insulating substrate 2, the element piece 3 that is bonded and supported to the insulating substrate 2, the cover member 5 that is the second base material provided to cover the element piece 3, and the semiconductor device 82 connected in the recess section 52 provided on the upper surface 5b (top surface) of the cover member 5 are arranged. Since this configuration is the same as in the first embodiment, detailed description thereof will not be repeated. Further, the connection pad (not shown) of the semiconductor device 82 and an electrode 46 provided on an upper surface 2a of the insulating substrate 2 are connected to each other by a metallic interconnection (bonding wire) 87 that is a connection member, and the connection pad (not shown) of the semiconductor device 82 and the connection terminal 88 provided on the upper surface 81a of the base substrate 81 are connected to each other by a metallic interconnection 86 that is a connection member. In the figure, an example is shown in which eight metallic interconnections 87 and ten metallic interconnections 86 are provided, but the number of the interconnections is not particularly limited. Further, the electrical connection may be performed by direct bonding using gold bumps or the like as the connection members, instead of the metallic interconnections 86 and 87.

The upper surface 81a of the base substrate 81, the insulating substrate 2 connected to the upper surface 81a of the base substrate 81, the cover member 5, the semiconductor device 82, the metallic interconnections 87 and the metallic interconnections 86 are covered by the molded member 85 that is a coating member using an insulating resin or the like. The molded member 85 is formed by a thermosetting resin (epoxy resin or the like) using a transfer molding method, for example. The molded member 85 in this example has a peripheral surface that runs along the periphery of the base substrate 81, but does not necessarily run along the periphery of the base substrate. That is, as long as the members and portions to be coated can be covered, any shape may be used. Further, the upper surface of the molded member 85 may not be flat (in a planar shape), or may have an irregular shape.

According to the module 80 according to the second embodiment, the base substrate 81, the insulating substrate 2 and the cover member 5, connected to the base substrate 81, in which the element piece 3 is accommodated and bonded in the internal space therebetween, the semiconductor device 82 that is mounted and connected in the recess section 52 provided on the upper surface 5b that is the second surface of the cover member 5 are covered by the molded member 85. Accordingly, similarly to the first embodiment, it is possible to achieve the height reduction without increase in the planar area, and to achieve a firm module that is operable as a single package. Further, since the respective component portions and component members are covered by the molded member 85 that is the coating member, it is possible to provide the module 80 capable of maintaining stable characteristics with less influence from the outside.

Third Embodiment

Figure 5A:
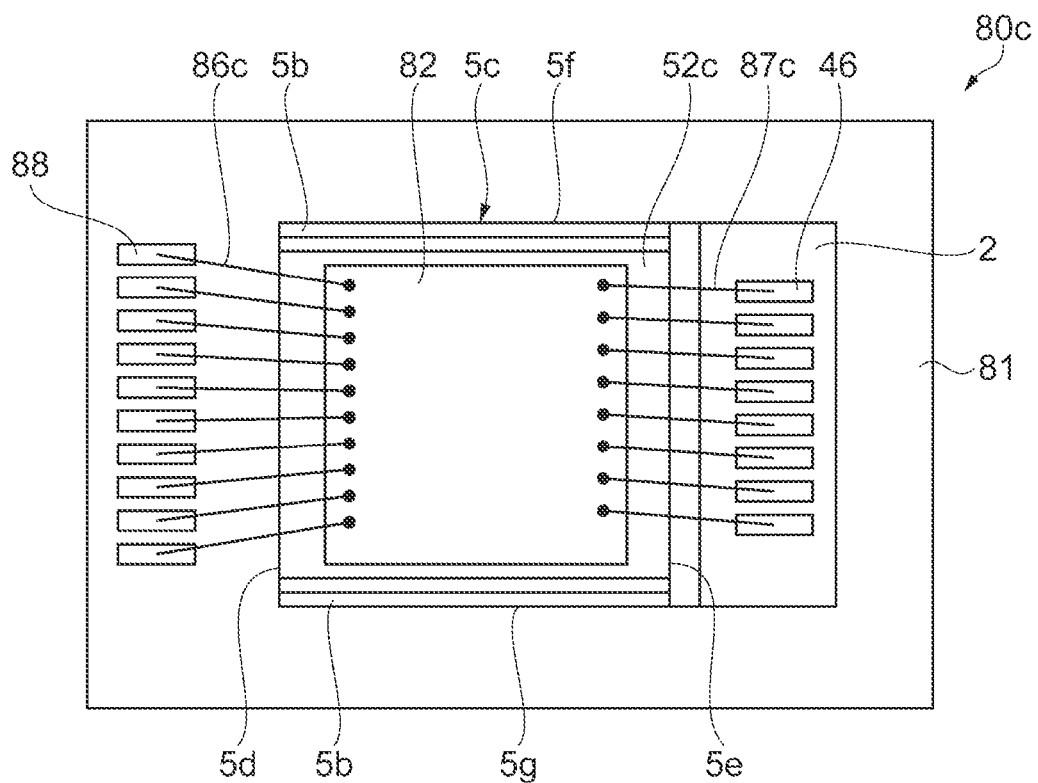
FIG. 5A is a plan view schematically illustrating a module according to a third embodiment of the invention.
Figure 5B:
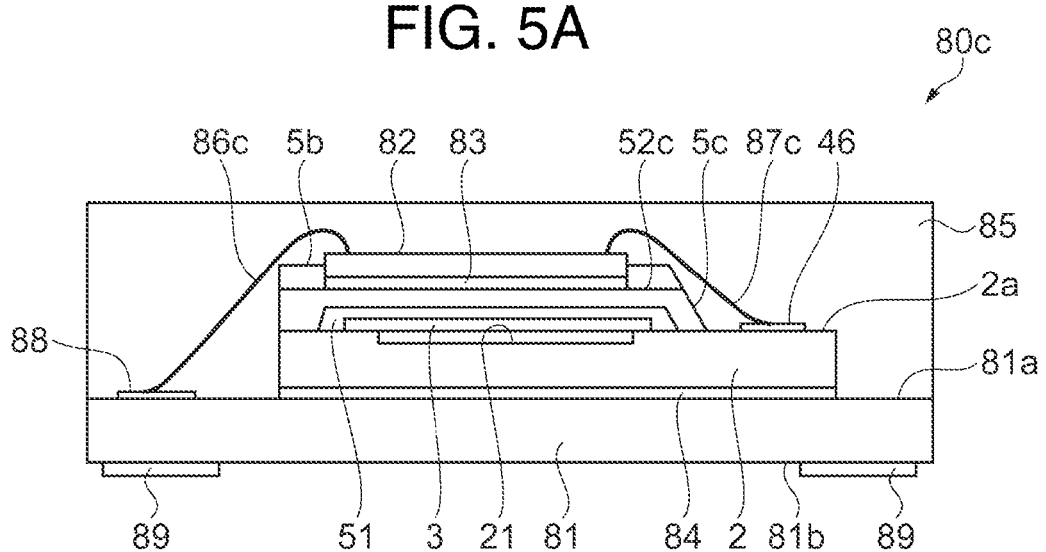
FIG. 5B is a front sectional view thereof.

A third embodiment of a module according to the invention will be described with reference to FIGS. 5A and 5B. FIG. 5A is a plan view schematically illustrating the module according to the third embodiment of the invention, and FIG. 5B is a front sectional view thereof. In description of the third embodiment, the same reference numerals are given to the same configurations as in the first and second embodiments, and description thereof will not be repeated. In a state shown in FIG. 5A, a molded member that forms the module is not shown.

A configuration of a module 80c shown in FIGS. 5A and 5B is almost the same as that of the module 80 of the second embodiment, but the shape of a recess section 52c provided on an upper surface 5b of a cover member 5 is different from that of the second embodiment. The module 80c includes a base substrate 81, an insulating substrate 2 that is a first base material connected to the base substrate 81, an element piece 3 that is a first functional element bonded and supported to the insulating substrate 2, and a cover member 5c that is a second base material provided to cover the element piece 3. Further, the module 80c includes a semiconductor device 82 that is a second functional element connected in the recess section 52c provided on the upper surface 5b of the cover member 5c. Further, the module 80c includes a molded member 85 provided to cover an upper surface 81a of the base substrate 81, the insulating substrate 2 that forms the module 80c, the cover member 5c and the semiconductor device 82. In the third embodiment, description of the same configurations as in the module 80 of the second embodiment will not be repeated, and the different recess section 52c will be mainly described.

The recess section 52c provided on the upper surface 5b (top surface) of the cover member 5c does not have walls on the side of a pair of opposite sides 5d and 5e of the cover member 5c and is opened toward the sides 5d and 5e with a bottom surface thereof being extended. In contrast, the recess section 52c has walls on the side of the other pair of opposite sides 5f and 5g. In other words, the recess section 52c is configured to be opened in a direction where metallic interconnections 86c and 87c of the semiconductor device 82 connected in the recess section 52c are provided so as to have no walls in the direction. Further, the metallic interconnections 86c and 87c are connected to connection terminals 88 and electrodes 46, respectively, through the portions of the cover member 5c without walls.

According to the module 80c of the third embodiment described above, it is possible to reduce a loop (interconnection shape) of the metallic interconnections 86c and 87c using the configuration of the cover member 5c. That is, when the walls are present in the recess section 52c, it is necessary to increase the height of the loop shape of the metallic interconnections 86c and 87c so that the metallic interconnections 86c and 87c are not in contact with the walls, but in the third embodiment, since there are no walls, it is possible to reduce the height of the loop shape of the metallic interconnections 86c and 87c by the height of the walls.

Modification Example of Recess Section

Figure 6A:
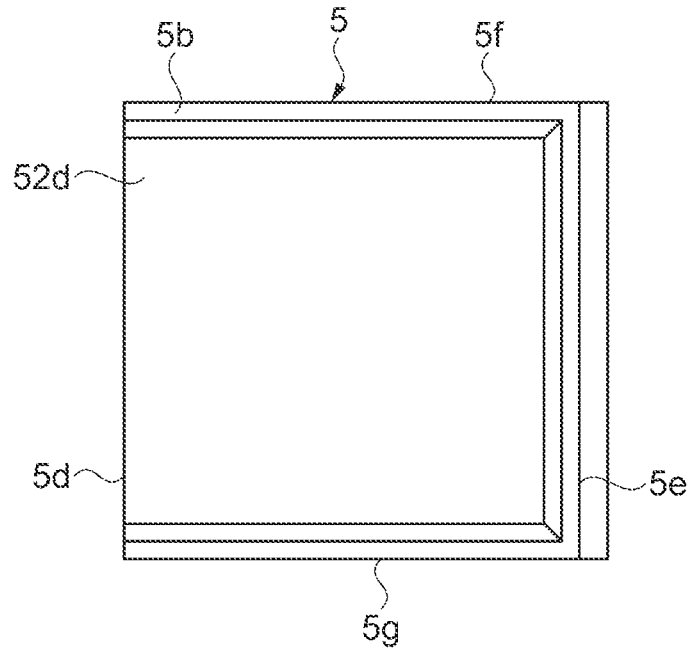
FIGS. 6A and 6B are plan views illustrating a modification example of a recess section provided in a cover member (second base material).
Figure 6B:
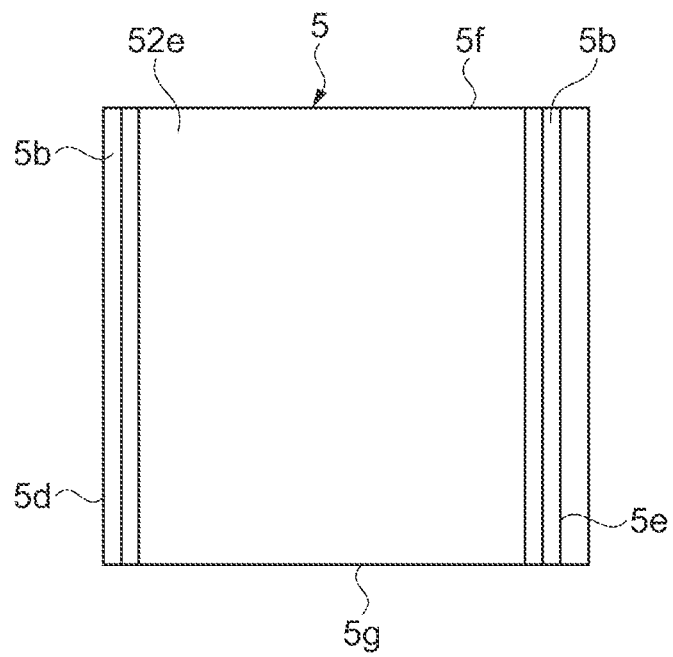

A modification example of the recess section provided on the cover member will be described with reference to FIGS. 6A and 6B using the cover member 5 of the first embodiment. FIGS. 6A and 6B are plan views illustrating modification examples of the recess section provided in the cover member that is the second base material.

A recess section 52d of modification example 1 shown in FIG. 6A has a configuration in which walls are present on three sides of the cover member 5 and one side is opened (without a wall). That is, the recess section 52d has the walls present along three sides 5e, 5f and 5g, and is opened on one side 5d (without a wall). According to the recess section 52d having this configuration, it is similarly possible to reduce the height of a module including a semiconductor module (not shown in the figure).

A recess section 52e of modification example 2 shown in FIG. 6B has a configuration in which walls are present on two sides of the cover member 5 and the other two sides are opened (without walls). That is, the recess section 52e has the walls present along two sides 5d and 5e, and is opened on the other two sides 5f and 5g (without walls). In the above-mentioned recess section 52e, it is similarly possible to reduce the height of a module including a semiconductor module (not shown in the figure).

In the above embodiments and modification examples of the recess section 52, the examples in which the walls are provided over the entire length along the sides of the cover member 5 are mentioned, but the walls are not necessarily formed along the entire length. For example, a configuration in which plural short walls are provided or a configuration in which a single wall is partially provided may be used. With such a configuration, it is possible to achieve the same effect.

In the above description, one element piece 3 is provided in one module 1, 80 or 80c, but plural element pieces 3 may be provided in one module 1, 80 or 80c.

Electronic Apparatus

Next, an electronic apparatus to which the module 1, 80 or 80c is applied, according to an embodiment of the invention, will be described in detail with reference to FIGS. 7 to 9. In description, an example to which the module 1 is applied is shown.

Figure 7:
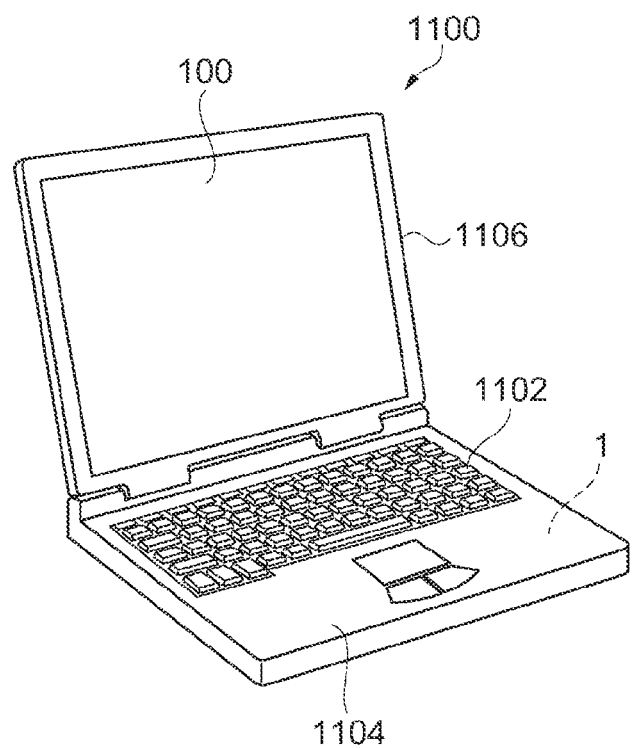
FIG. 7 is a perspective view illustrating a configuration of a mobile personal computer as an example of an electronic apparatus.

FIG. 7 is a perspective view schematically illustrating a configuration of a mobile (or notebook) personal computer as an example of an electronic apparatus that includes the module 1 according to an embodiment of the invention. In FIG. 7, a personal computer 1100 includes a main unit 1104 that includes a keyboard 1102, and a display unit 1106 that includes a display section 100. The display unit 1106 is rotatably supported to the main unit 1104 through a hinge section. The module 1 having a function of detecting an angular velocity is built in the personal computer 1100.

Figure 8:
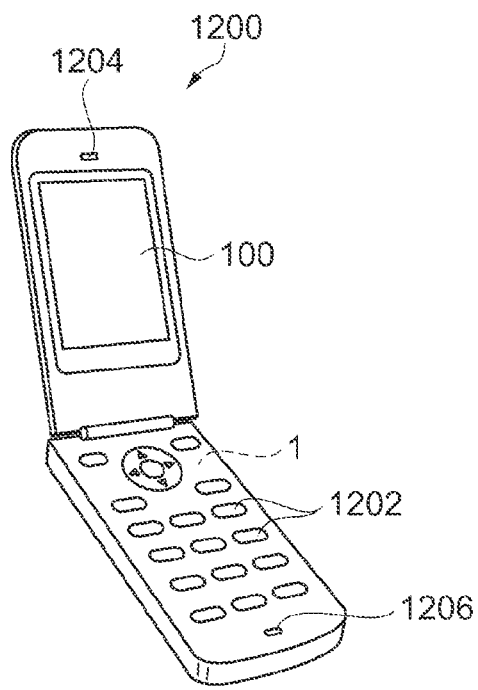
FIG. 8 is a perspective view illustrating a configuration of a mobile phone as an example of an electronic apparatus.

FIG. 8 is a perspective view schematically illustrating a configuration of a mobile phone (including a personal handy system (PHS)) as an electronic apparatus that includes the module 1 according to an embodiment of the invention. In FIG. 8, a mobile phone 1200 includes plural operating buttons 1202, an ear piece 1204 and a mouth piece 1206. A display section 100 is disposed between the operating buttons 1202 and the ear piece 1204. The module 1 that functions as an angular velocity sensor or the like is built in the mobile phone 1200 described above.

Figure 9:
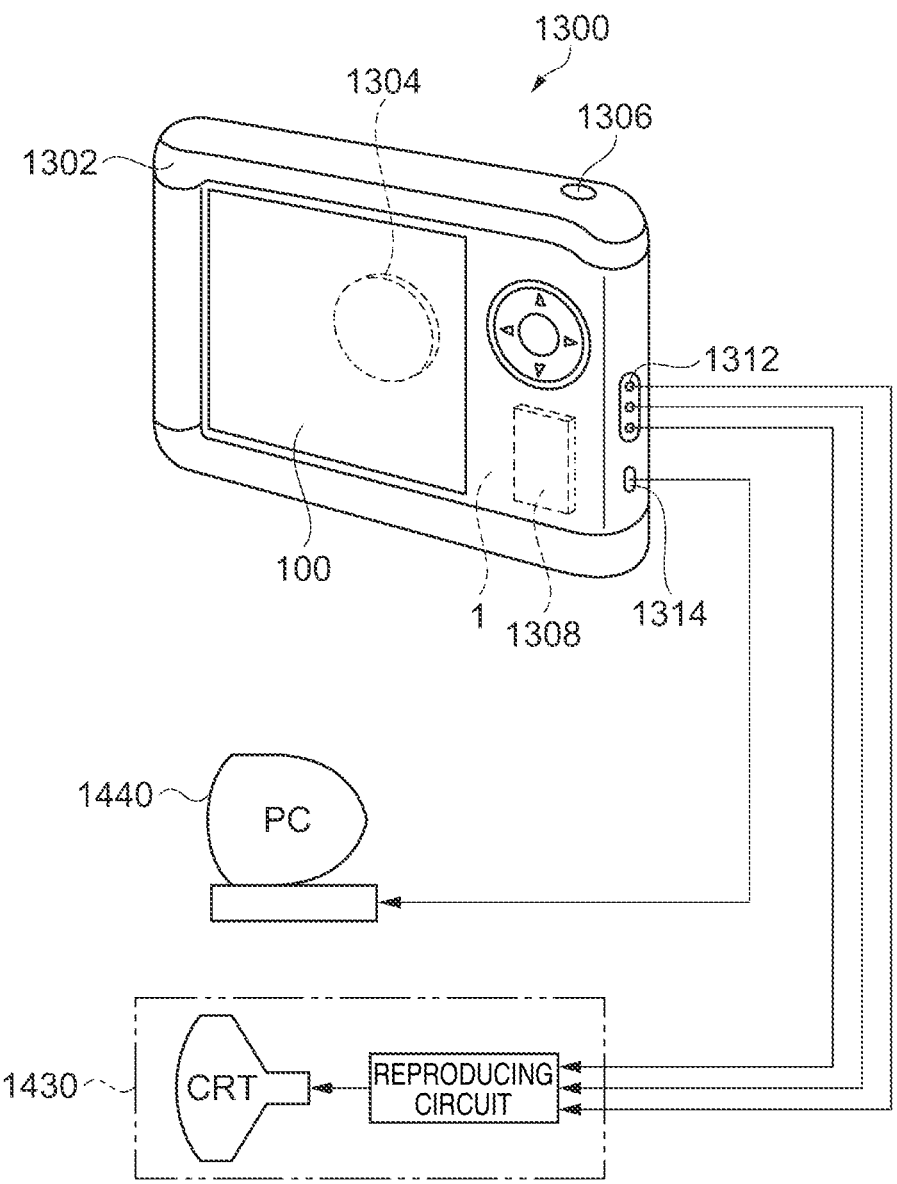
FIG. 9 is a perspective view illustrating a configuration of a digital still camera as an example of an electronic apparatus.

FIG. 9 is a perspective view schematically illustrating a configuration of a digital still camera as an electronic apparatus that includes the module 1 according to an embodiment of the invention. In FIG. 9, connection to an external apparatus is simply shown. Here, while a film camera in the related art has a configuration in which a silver salt photo film is exposed to light using an optical image of an object, a digital still camera 1300 has a configuration in which an optical image of an object is photo-electrically converted by an imaging element such as a charge coupled device (CCD) or the like to generate an imaging signal (image signal).

A display section 100 is provided on a rear surface of a case (body) 1302 of the digital still camera 1300, and performs display on the basis of the imaging signal from the CCD. Thus, the display section 100 functions as a finder that displays the object as an electronic image. Further, a light receiving unit 1304 that includes an optical lens (imaging optical system), a CCD or the like is provided on a front surface (rear surface in the figure) of the case 1302.

If a user confirms the image of the object displayed in the display section 100 and then pushes a shutter button 1306, an imaging signal of the CCD at that time is transmitted to and stored in a memory 1308. Further, in the digital still camera 1300, a video signal output terminal 1312 and a data communication input/output terminal 1314 are provided on a side surface of the case 1302. Further, as shown in FIG. 9, a television monitor 1430 may be connected to the video signal output terminal 1312, and a personal computer 1440 may be connected to the data communication input/output terminal 1314 as necessary. Further, the imaging signal stored in the memory 1308 is output to the television monitor 1430 or the personal computer 1440 by a predetermined operation. The module 1 that functions as the angular velocity sensor or the like is built in the digital still camera 1300.

The module 1 according to an embodiment of the invention may not only be applied to the personal computer (mobile personal computer) in FIG. 7, the mobile phone in FIG. 8, and the digital still camera in FIG. 9, but may also be applied to electronic apparatuses such as an ink jet discharging device (for example, an ink jet printer), a laptop personal computer, a television, a video camera, a video tape recorder, a car navigation device, a pager, an electronic organizer (including a device with a communication function), an electronic dictionary, a calculator, an electronic game machine, a word processor, a work station, a video phone, a crime prevention television monitor, electronic binoculars, a POS terminal, a medical device (for example, an electronic thermometer, a blood-pressure meter, a blood glucose monitoring system, an electrocardiographic device, an ultrasonic diagnostic device or an electronic endoscope), a fish-finder, various measuring devices, meters (for example, meters for vehicles, air planes or ships) or a flight simulator.

Moving Object

Figure 10:
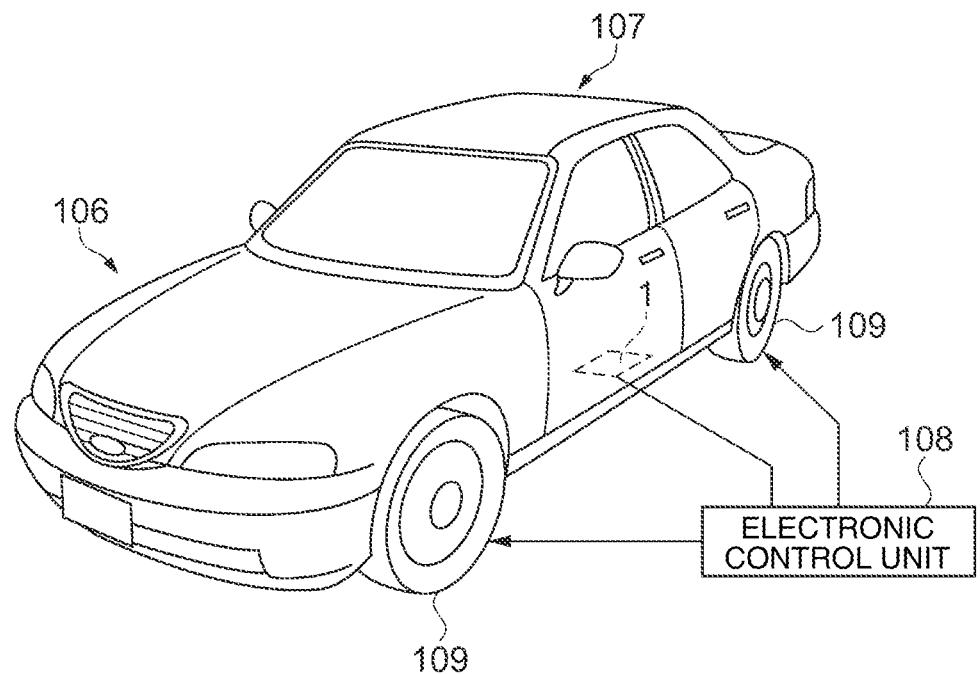
FIG. 10 is a perspective view illustrating a configuration of a motor vehicle as an example of a moving object.

FIG. 10 is a perspective view schematically illustrating a motor vehicle as an example of a moving object. The module 1 according to the invention is mounted in an automobile 106. For example, as shown in FIG. 10, in the auto vehicle 106 that is a moving object, an electronic control unit 108 that is therein built with the module 1 and controls tires 109 is mounted in a vehicle body 107. In addition, the module 1 may be widely applied to an electronic control unit (ECU) such as a keyless entry, an immobilizer, a car navigation system, a car air conditioner, an anti-lock brake system (ABS), an air bag, a tire pressure monitoring system (TPMS), an engine controller, a battery monitor of a hybrid automobile or an electric automobile or a car body attitude control system.

The entire disclosure of Japanese Patent Application No. 2013-040401, filed Mar. 1, 2013 is expressly incorporated by reference herein.

What is claimed is:

1. A module comprising:
a first base that has a first recess in a top surface of the first base;
a second base that is provided over the first base, the second base having second and third recesses in top and bottom surfaces thereof, respectively;
a first functional element that is accommodated in an internal space, which is provided by the first and third recesses, at least a part of the first functional element being surrounded by the first base and the second base; and
a second functional element that is mounted in a bottom surface of the second recess, wherein
the third recess is larger than the first recess in a plan view,
the first base is larger than the second base in the plan view, and
the first functional element is a physical quantity sensor having movable and fixed electrodes, and the movable electrodes are completely enclosed by an outer edge of the first recess in the plan view.

2. The module according to claim 1,
wherein the second functional element is connected to the bottom surface of the second recess by a bonding material.

3. The module according to claim 1,
wherein the second recess has a side wall, and a part of a periphery of the second functional element is laterally shifted from the side wall in the plan view.

4. The module according to claim 2,
wherein the second recess has a side wall, and a part of a periphery of the second functional element is laterally shifted from the side wall in the plan view.

5. The module according to claim 1, further comprising:
a base substrate,
wherein the first base is mounted over the base substrate.

6. The module according to claim 5,
wherein the second functional element is electrically connected to at least one of the base substrate and the first base by a connection member.

7. The module according to claim 6,
wherein the first base, the second base and the connection member are coated with a coating member.

8. An electronic apparatus comprising the module according to claim 1.

9. A moving object comprising the module according to claim 1.

* * * * *